United States Patent [19]

Sanada

[11] Patent Number: 5,640,099
[45] Date of Patent: Jun. 17, 1997

[54] METHOD AND APPARATUS FOR DETECTING SHORT CIRCUIT POINT BETWEEN WIRING PATTERNS

[75] Inventor: Masaru Sanada, Tokyo, Japan

[73] Assignee: NEC Corporation, Tokyo, Japan

[21] Appl. No.: 506,982

[22] Filed: Jul. 28, 1995

[30] Foreign Application Priority Data

Jul. 29, 1994 [JP] Japan .................................. 6-177872

[51] Int. Cl.[6] ............................................. G01R 31/302
[52] U.S. Cl. ............................ 324/752; 324/765; 324/501
[58] Field of Search ................................. 324/500–501, 324/752, 765–770

[56] References Cited

U.S. PATENT DOCUMENTS

| | | | |
|---|---|---|---|
| 4,698,587 | 10/1987 | Burns et al. | 324/765 |
| 4,761,607 | 8/1988 | Shiragasawa et al. | 324/752 |
| 5,017,863 | 5/1991 | Mellitz | 324/751 |
| 5,053,699 | 10/1991 | Aton | 324/751 |
| 5,309,108 | 5/1994 | Maeda et al. | 324/501 |

FOREIGN PATENT DOCUMENTS 0216077  4/1987  European Pat. Off. .

OTHER PUBLICATIONS

Masaru Sanada, "Very Sensitive Detection for LSI's Hot Spots Using Liquid Crystals", 6th Int'l. Conference on Reliability and Maintainability, Oct. 1988, Strasbourg, France, pp. 516–521.

*Primary Examiner*—Kenneth A. Wieder
*Assistant Examiner*—Russell M. Kobert
*Attorney, Agent, or Firm*—Sughrue, Mion, Zinn, Macpeak & Seas

[57] ABSTRACT

A short circuit point is detected between wiring patterns on an integrated circuit which includes functional circuits and wiring patterns. For this purpose, an apparatus includes a power supply unit for applying a predetermined voltage between power supply wiring patterns of the integrated circuit such that the functional circuits are in a non-operating state. A current consumed between the power supply wiring patterns is continuously monitored. In this state, a laser beam is irradiated to a predetermined point on the integrated circuit and a current change amount is detected in response to the irradiation of the laser beam. The detection operation is performed for all the predetermined points. A short circuit point is determined between the wiring patterns from data indicating the current change amounts at the predetermined points.

15 Claims, 6 Drawing Sheets

METHOD AND APPARATUS FOR DETECTING SHORT CIRCUIT POINT BETWEEN WIRING PATTERNS

BACKGROUND OF THE INVENTION

1. Field of the Invention

The present invention relates to a method and apparatus for detecting a short circuit point between wiring patterns of an LSI, and more particularly, a method and apparatus for detecting a short circuit point between wiring patterns using a non-contact detection method in a test process of a manufactured LSI.

2. Description of Related Art

In a test process of the manufacturing processes of an LSI, it is difficult to detect a short circuit point. Specifically, in a case of completion of an LSI circuit such as an application specific IC (ASIC) ordered by a user for delivery within a short period of time, a short circuit problem sometimes occurs. A short circuit is typically formed between a plurality of power supply wiring patterns because there are crosses between power supply wiring patterns and because bugs of wiring design data, error in setting the coordinates of wiring patterns, or overlapping wiring patterns are occasionally introduced in the CAD process. Such a type of short circuit between the power supply wiring patterns is the cause of incomplete operation of logic circuits as a main functional circuit of the ASIC.

In highly integrated circuits, it is very difficult to detect a point where the short circuit is formed. Conventionally, there is a method of visually checking the wiring mask pattern as a method of detecting a short circuit point between wiring patterns. However, it is impossible to completely check the wiring mask pattern for a large scaled integrated circuit layout.

There are two conventional methods of physically detecting a short circuit point between wiring patterns other than the visual method, a first method being a method of detecting a heat generating point using liquid crystal and a second method being a method of burning off a short circuit point by flowing high current.

The first conventional method of detecting a short circuit point between wiring patterns is described in "Very Sensitive Detection for LSI's Hot Spot using Liquid Crystal" (Proceedings of 6th International Conference on Reliability and Maintainability (Strasbourg France) October, 1988, pp. 516 521–521) (reference 1). According to reference 1, the temperature at a short circuit point between two power supply wiring patterns, e.g., a 5 V power supply line (VDD) and a ground line (GND) is increased as the voltage of power supply line VDD is increased. When temperature of liquid crystal is increased so that a phase transition temperature (Tc) of the liquid crystal is exceeded, the molecule structure of liquid crystal changes from a liquid crystal structure to a liquid structure. At the same time, the optical characteristics change from a birefringence state to an isotropic state. The change can be observed by a polarization microscope. Therefore, a thin liquid crystal film is coated uniformly on an LSI for the short circuit point detection and then power is supplied. In this case, if there is no short circuit point, the entire LSI does not exceed the phase transit temperature and the phase transition of liquid crystal does not occur. If there is any short circuit point, temperature of the short circuit point is increased and the phase transition of liquid crystal is caused. Therefore, when the LSI is observed by the polarization microscope, the presence or absence of a short circuit point can be observed. A liquid crystal having a liquid crystal characteristic at room temperature and having a phase transition temperature at 35° C. or above which is somewhat higher than the room temperature is selected, in order to make the testing current as small as possible. Further, the entire LSI is heated slightly below the phase transition temperature (Tc) using a temperature controller to detect small heating up, as shown in FIG. 1A. As a result, a small increment of the temperature enables the liquid crystal to reach the phase transition temperature. Alternatively, the entire LSI can be heated slightly over the phase transition temperature (Tc), as shown in FIG. 1B. In this case, when the entire LSI is gradually cooled, a small heating value point can be observed when the temperature of LSI crosses the phase transition temperature (Tc). However, even in this method, it is essential to increase current for detecting a short circuit point between power supply wiring patterns.

Power consumption is expressed as $P=V \cdot I=R \cdot I^2$ as is well known. It is necessary to increase the power consumption in order to increase the heating value. However, since impedance R is extremely small at the short circuit point between wiring patterns, current I needs to be increased to increase power consumption.

The second conventional method of detecting a short circuit point between wiring patterns is a method where a large current is supplied to power supply wiring patterns of an LSI to increase a current density at a short circuit point. Utilizing that current concentrated at the short circuit point, the short circuit point is fused. In order to fuse the short circuit point between the power supply wiring patterns, electron migration needs to be caused so that the short circuit point gets higher current density than other portions of power supply wiring patterns. In the electron migration phenomenon, cavities are generated on the current supply side of the wiring patterns through moment exchange between electrons as carriers of current and metal lattices, and protrusion or needle-like crystal growth is caused on the opposite side.

Recently, an application specific IC (ASIC) such as a gate array has been widely used. It includes standardized functional circuits such as standard cells and gate arrays and the wiring design is made to a semiconductor substrate somewhat standardized using a computer-aided design (CAD). After the wiring design is complete, a mask for wiring patterns is produced and applied to the semiconductor substrate in which a diffusion process is completed, to form the wiring patterns, resulting in circuits having predetermined functions. Specifically, in a case of ASIC, since the power supply wiring patterns for an internal logic circuit are formed in a network manner, current density is extremely decreased other than at the short circuit point. For this reason, the short circuit point is first fused through application of large current. However, there is a possibility that a semiconductor element having no relation to the short circuit point is damaged because application of a high voltage is necessary for application of a large current. In order to prevent damage to the semiconductor element, the current value must be limited to some extent and therefore it is difficult to precisely specify the short circuit point.

In the above mentioned first and second conventional methods and apparatus for detecting a short circuit point between wiring patterns, there is a drawback in that increase in temperature through application of a large current is necessary for detection of a short circuit point.

Further, in the conventional second method of detecting a short circuit point between wiring patterns, there is a drawback in that it is difficult to precisely specify a short circuit point because the current value is limited in order to prevent a semiconductor element from being damaged through application of a high voltage accompanied with the application of large current.

SUMMARY OF THE INVENTION

Therefore, the present invention has, as an object, to provide a method and apparatus for detecting a short circuit point between wiring patterns of an LSI in a non-contact manner by using laser beams.

Another object of the present invention is to provide a method and apparatus for detecting a short circuit point between wiring patterns of an LSI with a relatively small current without damaging another semiconductor element.

Still another object of the present invention is to provide a method and apparatus for visually representing a short circuit point between wiring patterns of an LSI.

It is an object of the present invention to provide a method and apparatus for detecting a defective point of a target by measuring a change in one of the electric properties of the target.

In order to achieve an aspect of the present invention, an apparatus for determining whether a target is defective or non-defective, the target including a first portion delivering energy and a second portion consuming the energy, includes a power unit for applying the energy to the first portion in a state in which the second portion does not consume the energy; a section for irradiating a laser beam to predetermined points on the target; a detecting unit for continuously measuring an electric property of the target, and for detecting a change amount of the electric property in response to the irradiation of the laser beam for every predetermined point; and a determining section for determining that the target is defective when any one of the detected change amounts is greater than a predetermined level.

In a preferred embodiment, the apparatus for detecting a short circuit point between wiring patterns on an integrated circuit which includes functional circuits and wiring patterns includes a power supply unit for applying a predetermined voltage between power supply wiring patterns of the integrated circuit such that the functional circuits are in a non-operating state; a section for sequentially irradiating a laser beam to predetermined points on the integrated circuit; a detecting unit for detecting current flowing through the power supply wiring patterns in response to the irradiation of the laser beam for every predetermined point; and a determining section for determining a change amount of the current in response to the irradiation of the laser beam for every predetermined point and determining a short circuit point between the wiring patterns from data indicative of the current change amounts of the predetermined points.

In this case, the predetermined voltage is 1.0 V or below when the functional circuits are constituted of only transistors having a MOS structure and 0.6 V or below when the functional circuits includes a transistor having a bipolar structure.

The predetermined points are specified by inputting data indicative of a size of the integrated circuit from an input unit, by graphically displaying a layout diagram showing the integrated circuit by a display unit, by pointing portions corresponding to the predetermined points on the displayed layout diagram by a pointing unit, and by determining physical coordinate positions of the predetermined points with reference to a reference point from the size data and pointed portions.

Bars for the predetermined points generated from the current change amounts are displayed on the display unit as a function of coordinate values of the predetermined points from a reference point as a bar graph. In this case, the bar graph may be displayed such that the bars having different height are distinguishable with different colors, or in two color using a threshold value.

The determining section differentiates the current change amount data with respect to a coordinate for the predetermined points in two-dimensional directions and determining short circuit points from the differentiating result.

In order to achieve another aspect of the present invention, a method is disclosed for detecting a short circuit point between wiring patterns on an integrated circuit which includes functional circuits and wiring patterns, comprising the steps of:

(a) applying a predetermined voltage between power supply wiring patterns of an integrated circuit such that the functional circuits are in a non-operating state;

(b) irradiating a laser beam to a point on the integrated circuit;

(c) measuring a change amount of current flowing through the power supply wiring patterns in response to the irradiation of the laser beam;

(d) repeating the steps of (a), (b) and (c) over predetermined points of a first level; and (e) determining a short circuit point between the wiring patterns from data indicating the change amounts of the predetermined points.

The method may further include the step of repeating the steps of (a), (b) and (c) with respect to the predetermined points of a second level, when it is determined that the current change amount of one or more of the predetermined points have a predetermined value. By using this step, a combination of rough detection and fine detection can be achieved, resulting in a short detection time.

DETAILED DESCRIPTION OF PREFERRED EMBODIMENT

A short circuit point detecting apparatus according to the present invention will be described below with reference to the accompanying drawings.

Figure 1A:
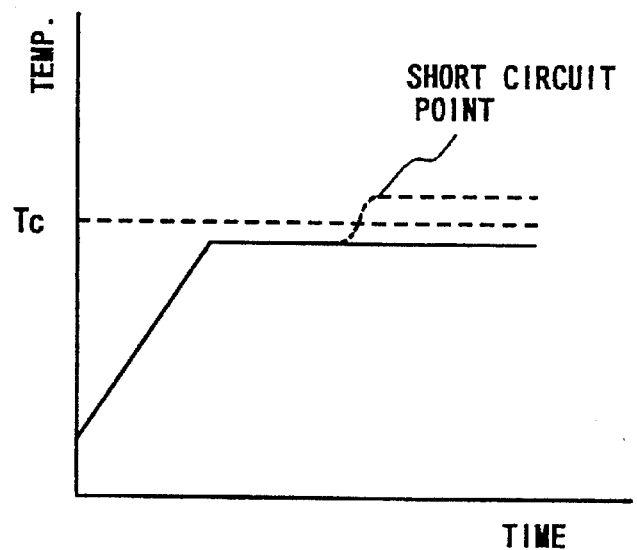
FIGS. 1A and 1B are temperature curves of liquid crystal when a short circuit point is detected.
Figure 1B:
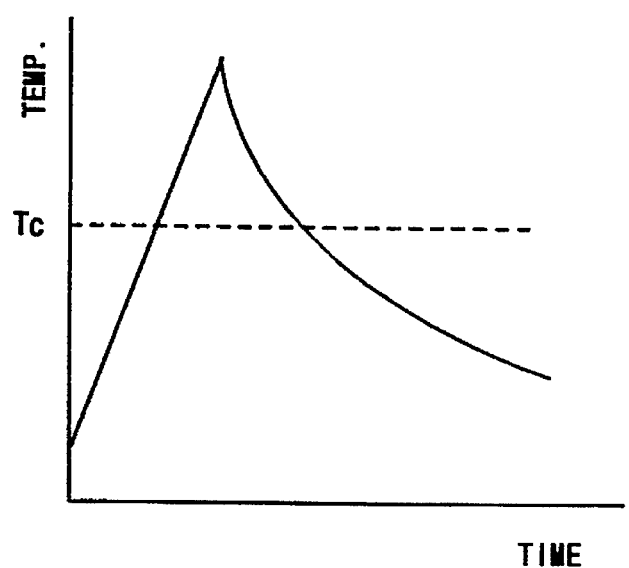
Figure 2:
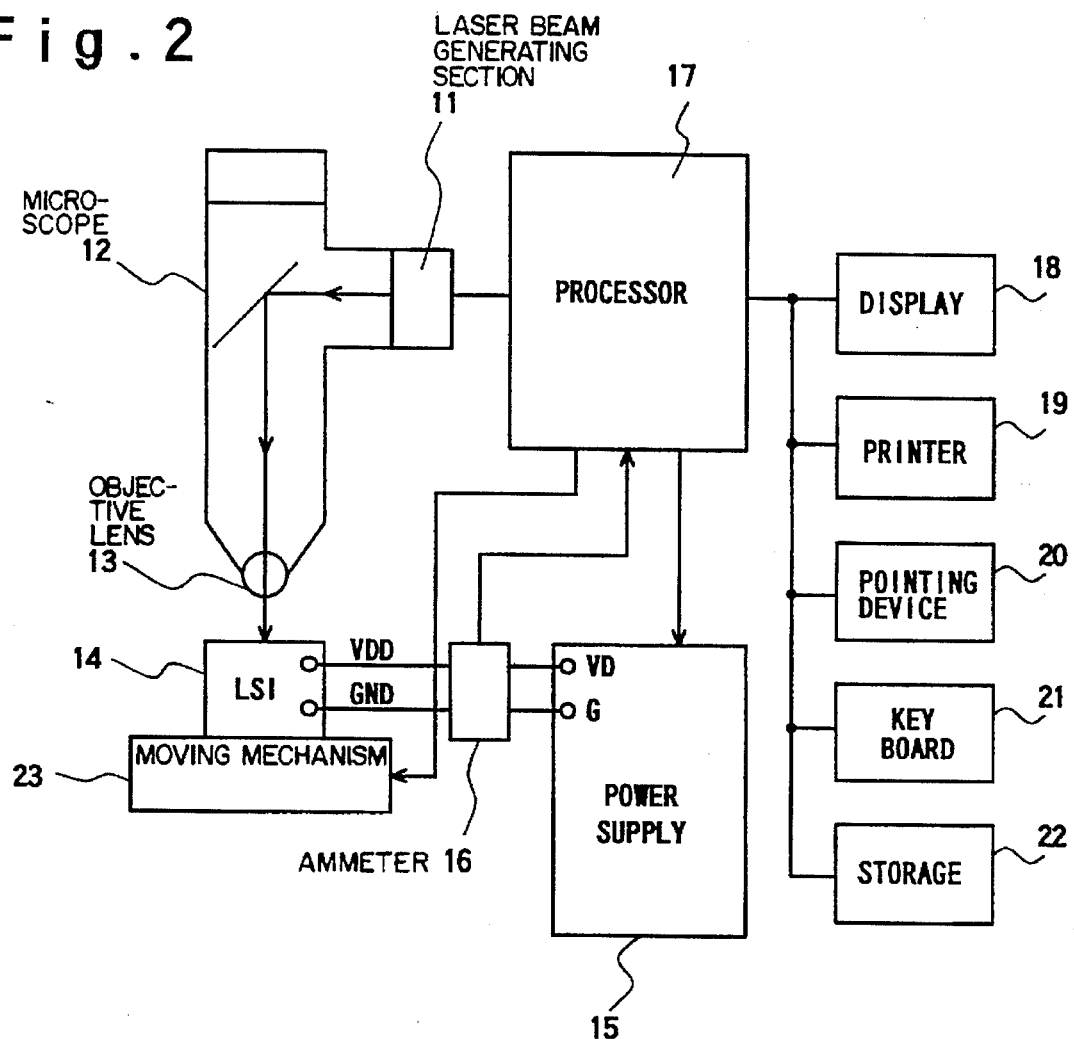
FIG. 2 is a block diagram showing a short circuit point detecting apparatus according to an embodiment of the present invention.

First, referring to FIG. 2, the structure of the short circuit point detecting apparatus will be described. The detecting apparatus includes a processor 17 for controlling various sections of the apparatus and finally detecting a short circuit point. A laser beam generating section 11 which is composed of a He—Ne laser, generates a laser beam in response to a generation instruction from the processor 17. The laser beam is introduced into a microscope 12. The laser beam is reflected by a mirror and irradiated to an LSI chip 14 as a target through an objective lens 13. The LSI chip 14 is an application specific IC (ASIC) in this embodiment and has a plurality of terminals including power supply terminals. Also, the LSI chip 14 has a physical reference point and is located on a bed of a moving mechanism 23. The moving mechanism 23 can move the LSI chip 14 in a two-dimensional direction in response to a movement instruction from the processor 17. Therefore, the laser beam can be scanned on the LSI chip 14. The power supply terminals of the LSI chip are supplied with a predetermined voltage from a power supply unit 15 for supplying a constant voltage in response to a supply instruction. An ammeter 16 is interposed between the power supply unit 15 and the LSI chip 14 and monitors a current flowing from the power supply unit 15 into the LSI chip 14 and informs the detecting result to the processor 17.

The processor 17 is connected via a system bus to a display unit 18, a printing unit 19, a pointing device 20, a keyboard 21, and a storage unit 22. The storage unit 22 stores various data files including a data file of a pattern layout of the LSI chip 14. The display unit 18 displays the pattern layout for specifying measuring points in response to a layout display instruction, and a bar graph as the detecting result in response to a bar graph display instruction from the processor 17. The printing unit 19 prints out a detecting result, specifically, coordinate values of a short circuit point and the current change amount in response to a print instruction from the processor 17. The pointing device 20 such as a mouse is used to specify measuring points. The keyboard 21 is used to input an actual size of the pattern layout which is displayed on the display unit 18. As a result, given a reference point on the LSI chip 14, the laser beam can be moved to the measuring points, i.e., scanned between the measuring points.

Next, the operation of the detecting apparatus will be described below with reference to FIGS. 3A to 3C.

Figure 3A:
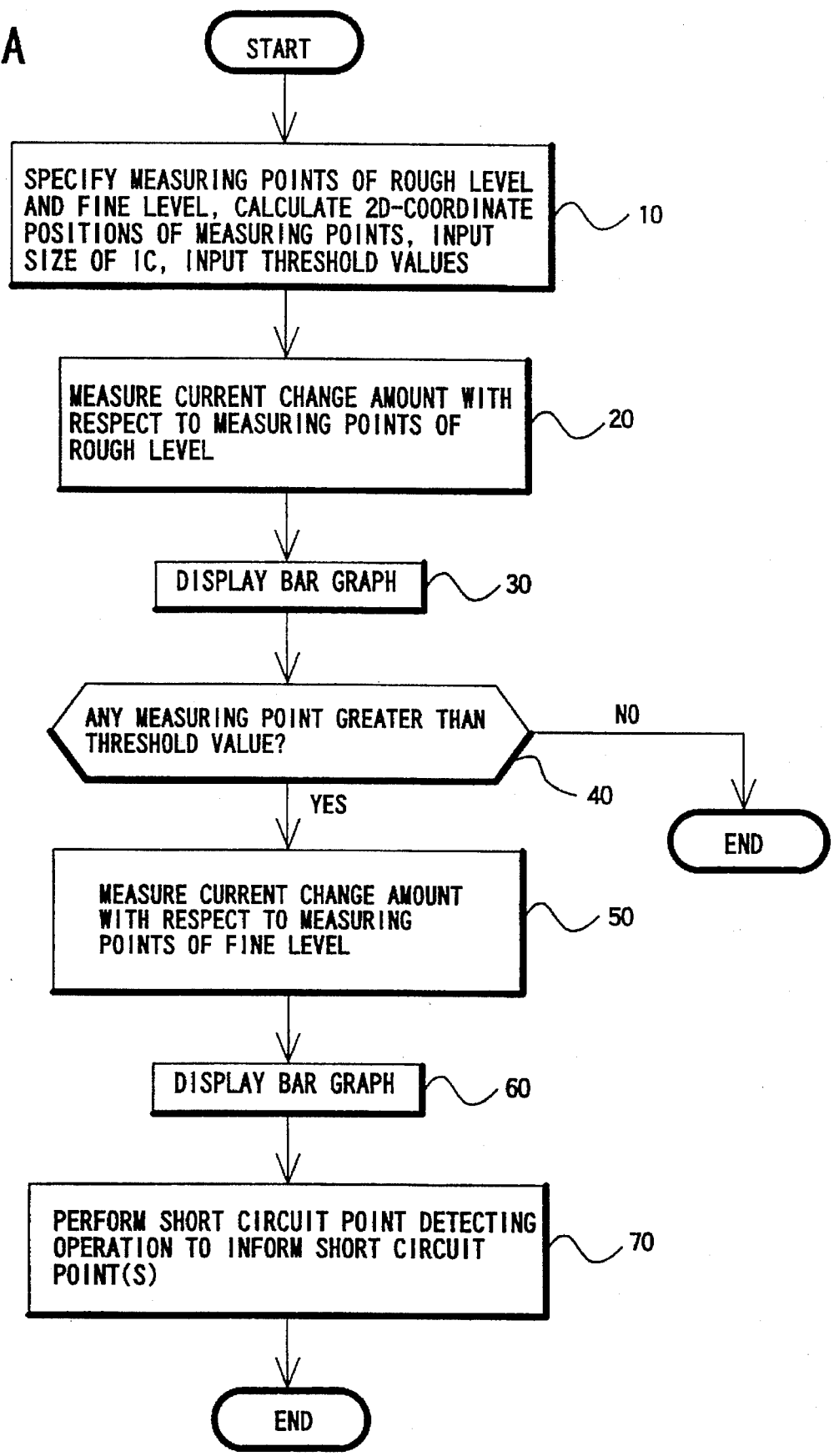
FIGS. 3A to 3C are flow charts explaining the operation of the short circuit point detecting apparatus of FIG. 2.
Figure 5:
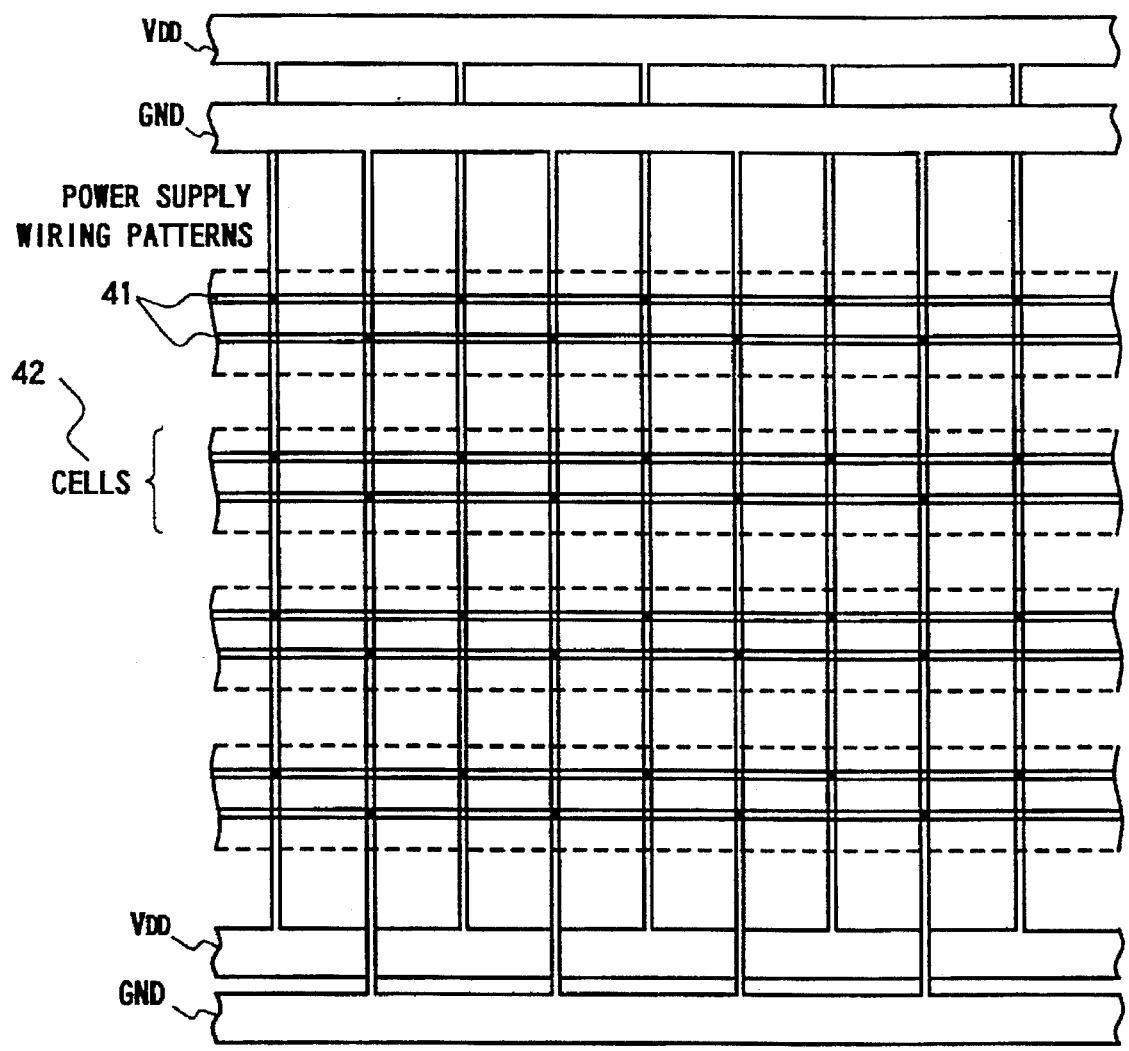
FIG. 5 is a diagram showing a layout of the LSI.

First, referring to FIG. 3A, the measuring points are specified in a step 10. In this embodiment, the measuring points are specified with two levels, i.e., a rough level and a fine level. More specifically, a pattern layout shown in FIG. 5 is read out of the storage unit 22 by the processor 17 and displayed on the display unit 18 in response to a layout display instruction from the processor 17. The pattern layout of the LSI chip 14 includes power supply lines VDD and GND to which power supply wiring patterns 41 are connected. Connection points are shown in the figure with black dots. The pattern layout also includes a plurality of cells 42 each composed of a function logic circuit (not shown). The logic circuit may be constituted of only transistors having a CMOS structure or may include a transistor having a bipolar structure.

A user inputs data indicative of the size of the pattern layout displayed on the display unit 18 from the keyboard 21 to the processor 17. Also, threshold values are inputted. Subsequently, the user points to measuring points of a rough level and then a fine level corresponding to actual measuring points on the power supply wiring patterns on the screen of the display unit 18 by using the pointing device 20. The processor 17 calculates coordinate values of the pointed measuring points from a reference point (not shown) on the pattern layout.

In the above embodiment, the pattern layout of the LSI chip is stored in the storage unit 22 and read out of it to be displayed on the display unit 18. However, coordinate values of the actual measuring points with respect to the reference point may be input from the keyboard 21 by the user. In this case, the processor 17 does not need to calculate the coordinate values of the actual measuring points.

Figure 4:
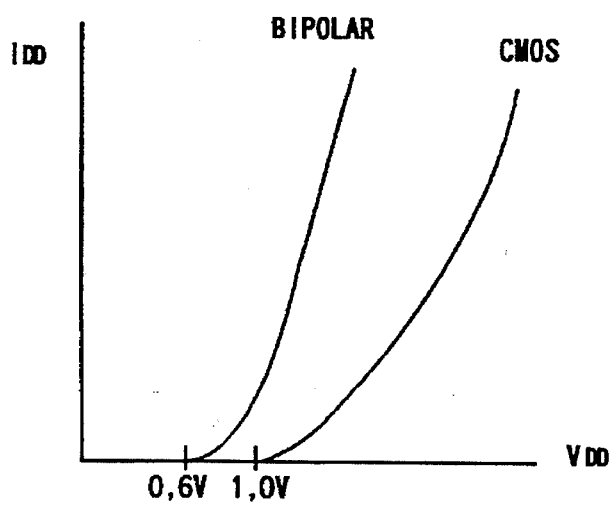
FIG. 4 is characteristic curve of transistors having a bipolar structure and a CMOS structure which are used in an LSI, respectively.

Next, in a step 20, current change amounts are measured in the measuring points of the rough level. More particularly, referring to FIG. 3B, after the reference point on the LSI chip 14 is adjusted by the moving mechanism 23, the processor 17 issues a power supply instruction to the power supply unit 15 in a step 21. The power supply terminals of the LSI chip 14 are supplied with a predetermined voltage of 1.0 V or below, or of 0.6 V or below from the power supply unit 15, depending upon the type of transistors constituting the functional logic circuits of the LSI chip 14. Referring to FIG. 4, it shows the voltage-current characteristics when only the high voltage is applied to a transistor having a CMOS structure and a transistor having a bipolar structure. As seen from the figure, if the voltage supplied from the power supply unit 15 is 1 V or below, the N-channel transistor and P-channel transistor are both set in the OFF state. On the other hand, if the supplied voltage is 0.6 V or below, a bipolar transistor is set in the OFF state. Therefore, when all the transistors of the LSI chip 14 are of the CMOS structure, the power supply voltage of 1 V or below is selected, whereas, when a bipolar transistor is contained in the LSI chip 14, the power supply voltage of 0.6 V or below is selected. In this state, the entire LSI is set in a non-operating state so that the power is not consumed.

When the predetermined voltage is supplied from the power supply unit 15 to the LSI chip 14, the ammeter 16 continuously monitors the current flowing through the power supply wiring patterns 41 in a step 22 and informs the monitored result to the processor 17. In this state, a generation instruction is issued from the processor 17 in a step 23 and a laser beam is emitted from the laser beam generating section 11 and irradiated to one of the measuring points of the rough level on the LSI chip 14. In this embodiment, a He—Ne laser having the wavelength of 632.8 nm and the output power of 2 mW is used in the laser beam generating section 11. The irradiation time is about 1 sec. per one measuring point. After one measuring point is irradiated by the laser beam, another measuring point is irradiated, that is, the laser beam is scanned over the measuring points of the rough level. In a target ASIC in the embodiment, since the wiring patterns are standardized as shown in FIG. 5, the above change amounts of current can be readily taken into the processor 17 for all the measuring points by scanning the laser beam in a predetermined sequence, i.e., by moving the LSI chip 14 by the moving mechanism 23 in response to a movement instruction from the processor 17. When the laser beam is irradiated to one measuring point on a power supply wiring pattern, the temperature of the wiring pattern is increased at and around the point where the laser beam is irradiated. According to a simulation of temperature increase of the wiring pattern due to the irradiation of laser beam, it is expected that the temperature is increased by about 2° C. As a result of the temperature increase, a resistance of the wiring pattern at and around the irradiated point increases. According to the above simulation, the increment of the resistance of the wiring pattern is about 2%. In this case, if the supplied voltage is constant, a change amount of current $\Delta I_p$ is given by the following equation from the Ohm's law.

$$\Delta I_p = (I/R) \cdot \Delta R \tag{1}$$

where I is a current when the laser beam is not irradiated anywhere, R is a resistance of the LSI chip 14 from the ammeter side, and ΔR is a change amount of resistance of the wiring pattern irradiated by the laser beam. Therefore, a short circuit point can be detected by calculating the change amount of current ΔIp. Since the power supply wiring patterns are arranged in a network manner, as shown in FIG. 5, the resistance of a portion of the wiring pattern network where any short circuit point is present is very low and the resistance of a portion of the wiring pattern network where no short circuit point is present is relatively high. Therefore, the resistance of a non-short circuit point portion is greater than that of a short circuit point portion and the change amount is also greater. Considering a voltage distribution of the inside of LSI chip 14, since a potential at the short circuit point is maximum, a value of ΔIp is also maximum.

Figure 3B:
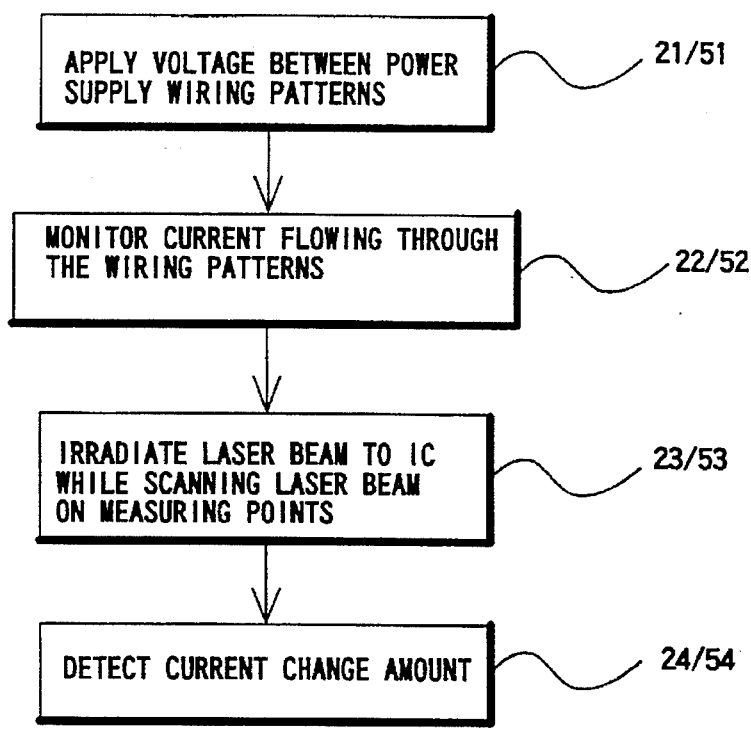
Figure 3C:
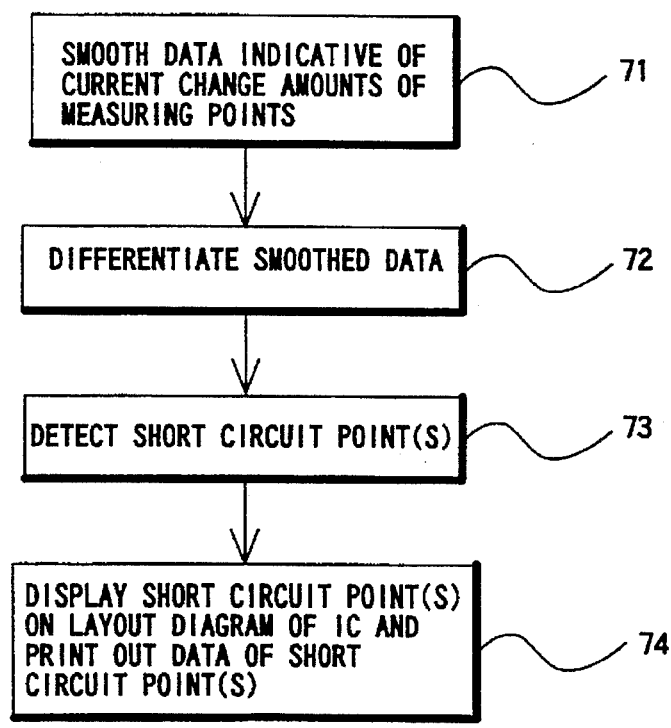

In step 24 of FIG. 3B, the processor 17 calculates a change amount of current when the laser beam is irradiated and stores the calculated change amount of current (ΔIp) as a function of the irradiating measuring points (Xi, Yi) for every measuring point for the rough level.

Figure 6:
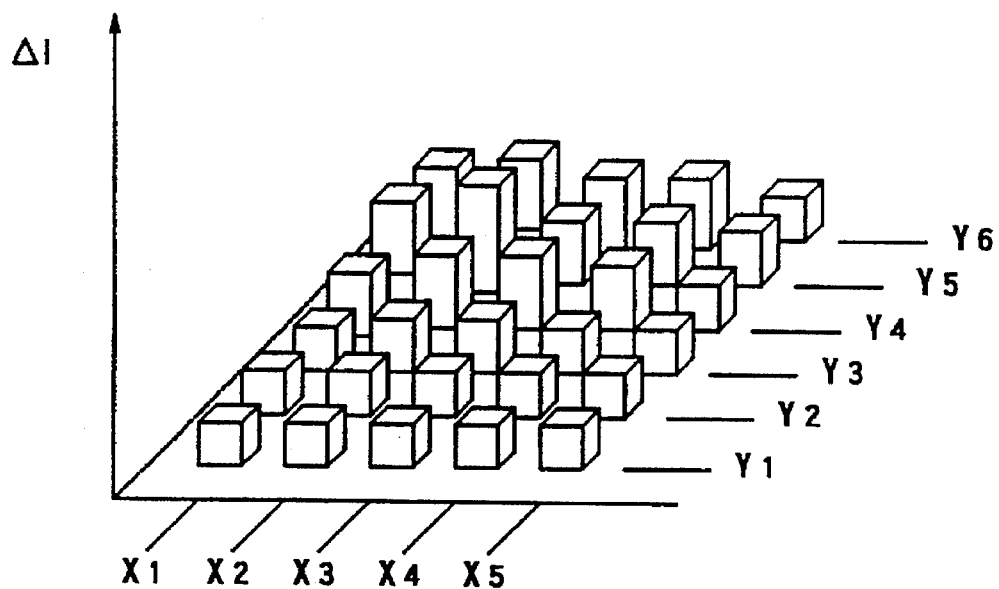
FIG. 6 is a bar graph of current change amount in a three-dimensional manner.
Figure 7:
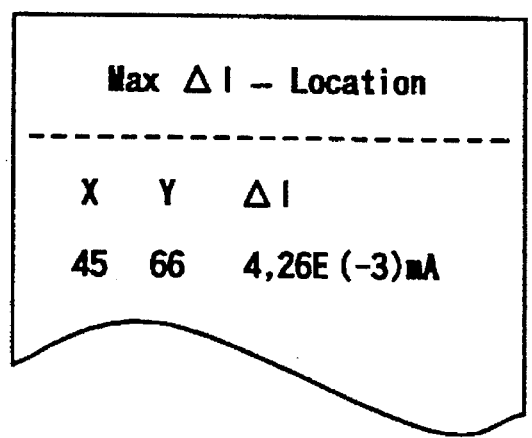
FIG. 7 is a diagram showing a printing result.

Next, the processor 17 generates a bar graph from the current change amounts in all the measuring points of the rough level and issues a bar graph display instruction such that the bar graph is displayed on the display unit 18 as shown in FIG. 6. Each of the bars has the calculated change amount of current (ΔIp). In FIG. 6, the bars stand on the coordinate positions of the measuring points. However, the bars may stand on the pattern layout of the LSI chip 14 at the positions corresponding to the measuring points displayed on the display unit 18. Further, in FIG. 6, each bar is drawn with a single color. However, each bar may be drawn in two colors, e.g., a bar having a great current change amount is drawn in red and a bar having a small current change amount is drawn in a blue. Alternatively, the gradation of color may be changed depending upon the height of the bar.

In step 40, it is determined whether or not there is any bar which is higher than a threshold value. If not, the test process is ended. If there is any bar which is higher than the threshold value, the test process proceeds to a step 50. In this embodiment, the determination is performed by the processor 17. However, the determination may be performed by the user who observes the bar graph.

In step 50, the current change amounts are determined for the measuring points of the fine level. The measuring points of the fine level is specified in advance in the step 10 around of the point selected as described above. This process is the same as in the step 20 and therefore the description is omitted. Also, in a step 60 the bar graph for the measuring points of the fine level is displayed, as in the step 30.

In step 70, a short circuit point is detected. More specifically referring to FIG. 3C, in a step 71, data indicative of current change amounts of the measuring points of the fine level is smoothed in a two-dimensional direction. Then in step 72, the smoothed data is differentiated in a two-dimensional direction, i.e., with respect to x- and y-coordinates. In step 73, it is determined that a point having the differentiated value of 0 when the differentiated value changes from a positive value to a negative value is a short circuit point. By this method, a plurality of short circuit points can be detected. In a step 74, the position information and current change amount of the detected point is printed out in response to a print instruction from the processor 17 together with the display of a bar graph as described above.

It should be noted that the smoothing and differentiating processes may be applied to the step 40. In the embodiment, the measuring points are specified in advance. However, the detection operation may be performed by specifying the measuring points one by one and then by comparing the current change amount of the measuring point with a predetermined threshold value to detect a short circuit point. In this manner, the detecting operation can be performed based on either of a visual method of using the bar graph, a method of differentiation, or a method of comparing with a predetermined threshold value.

According to the present invention, the period of time when the laser beam is irradiated is 1 sec per 1 point. Thus, since high speed measurement is possible, the detecting operation is completed quickly. Further, the short circuit point can be recognized immediately from a visual output.

When there are many short circuit points to be detected, abnormal areas are first detected through rough measurement in units of functional circuits and then detailed measurement is performed in the detected abnormal areas. In this manner, the reduction in time and steps can be made.

The present invention is a novel method, and since the distribution of current and distribution of current density on the LSI chip can be observed visually, the value of the present invention will increase.

As described above, in the method of detecting a short circuit point between wiring patterns and apparatus for the same according to the present invention, since the detection operation is made in a non-contact manner without flowing a large current, the short circuit point can be detected quickly without erroneous determination and destroying the functional circuits of an LSI.

What is claimed is:

1. An apparatus for detecting a short circuit point between wiring patterns on an integrated circuit which includes functional circuits and wiring patterns, comprising:

a power supply unit for applying a predetermined voltage between power supply wiring patterns of said integrated circuit such that the functional circuits are in a non-operating state;

means for sequentially irradiating a laser beam to predetermined measuring points on the wiring patterns of said integrated circuit such that a resistance of each of the wiring patterns increases;

a detecting unit for monitoring current flowing through said power supply wiring patterns in response to the irradiation of said laser beam for every measuring point, and for determining a change in said current due to the increase of the resistance in response to the irradiation of said laser beam for every measuring point; and determining means for determining a short circuit point between said wiring patterns from data indicative of said changes in said current of said measuring points.

2. An apparatus according to claim 1, wherein said predetermined voltage is 1.0 V or below when the functional circuits are constituted of only transistors having a MOS structure and 0.6 V or below when the functional circuits includes a transistor having a bipolar structure.

3. An apparatus according to claim 1, further comprising specifying means for specifying said measuring points, and wherein said specifying means comprises:

an input unit for inputting data indicative of a size of said integrated circuit;

a display unit for graphically displaying a layout diagram showing said integrated circuit;

a pointing to unit for pointing portions corresponding to said measuring points on said displayed layout diagram; and coordinate position determining means for determining physical coordinate positions of said measuring points with reference to a reference point from the size data and pointed portions.

4. An apparatus according to claim 1, further comprising:
a display unit for displaying data; and
bar graph means for generating bars for said measuring points from said current change amounts and displaying said bars on said display unit as a function of coordinate values of said measuring points from a reference point as a bar graph.

5. An apparatus according to claim 4, wherein said bar graph means displays said bars such that said bars having different heights are distinguishable with different colors.

6. An apparatus according to claim 1, wherein said measuring points are expressed by coordinate values and said determining means includes means for differentiating the current change amount data for said measuring points in two-dimensional directions and determining short circuit points from the differentiating result.

7. An apparatus according to claim 1, further comprising output means for outputting coordinate positions of the measuring points representative of the current change amount greater than a predetermined value.

8. A method for detecting a short circuit point between wiring patterns on an integrated circuit which includes functional circuits and wiring patterns, comprising the steps of:

(a) applying a predetermined voltage between power supply wiring patterns of an integrated circuit such that the functional circuits are in a non-operating state;

(b) irradiating a laser beam to a measuring point on the wiring patterns of said integrated circuit such that a resistance of each of the wiring patterns increases;

(c) measuring a change in current flowing through said power supply wiring patterns in response to the irradiation of said laser beam;

(d) repeating said steps of (a), (b) and (c) over measuring points roughly designated; and (e) determining a short circuit point between said wiring patterns from data indicating said changes in said current in said measuring points.

9. A method according to claim 8, wherein said predetermined voltage is 1.0 V or below when the functional circuits are constituted of only transistors having a MOS structure and 0.6 V or below when the functional circuits includes a transistor having a bipolar structure.

10. A method according to claim 8, further comprising the steps of:

inputting data indicative of a size of said integrated circuit;

graphically displaying a layout diagram showing said integrated circuit;

pointing to portions corresponding to said measuring points of said first level on said displayed layout diagram;

pointing to portions corresponding to said measuring points of a second level on said displayed layout diagram;

determining physical coordinate positions of said measuring points of said first and second levels with reference to a reference point from the size data and pointed to portions.

11. A method according to claim 10, further comprising the steps of:

when it is determined that the change amount of current of one or more of said measuring points have a predetermined value, repeating said steps (a), (b) and (c) with respect to said measuring points of said second level.

12. A method according to claim 8, further comprising the step of generating bars from said change amounts of current and displaying the bars as a function of coordinate values of said measuring points from a reference point as a bar graph.

13. A method according to claim 12, wherein said said displaying step includes displaying the bars such that bars having different height are distinguishable with different colors.

14. A method according to claim 8, wherein said determining step includes differentiating the change amount data with respect to the coordinate position of said measuring points in two-dimensional directions and determining short circuit points from the differentiating result.

15. A method according to claim 8, further comprising the step of outputting coordinate positions of said measuring points representative of the change amount greater than a predetermined value.

* * * * *